United States Patent
Isomoto et al.

(10) Patent No.: US 7,679,915 B2
(45) Date of Patent: Mar. 16, 2010

(54) MOTOR CONTROL APPARATUS AND METHOD OF ASSEMBLING MOTOR CONTROL APPARATUS

(75) Inventors: Kenji Isomoto, Fukuoka (JP); Shuhei Nohara, Fukuoka (JP); Shigekatsu Nagatomo, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 253 days.

(21) Appl. No.: 11/663,191

(22) PCT Filed: Aug. 22, 2005

(86) PCT No.: PCT/JP2005/015213

§ 371 (c)(1),
(2), (4) Date: Mar. 19, 2007

(87) PCT Pub. No.: WO2006/030606

PCT Pub. Date: Mar. 23, 2006

(65) Prior Publication Data

US 2008/0007919 A1 Jan. 10, 2008

(30) Foreign Application Priority Data

Sep. 17, 2004 (JP) .............................. 2004-272092

(51) Int. Cl.
*H05K 7/20* (2006.01)
*F28F 7/00* (2006.01)

(52) U.S. Cl. ..................... 361/715; 361/704; 361/709; 361/719; 165/80.2; 165/185

(58) Field of Classification Search ................ 361/704, 361/720, 715, 719; 165/80.3, 80.2; 174/16.3; 363/141

See application file for complete search history.

(56) References Cited

U.S. PATENT DOCUMENTS

| 7,206,204 | B2 * | 4/2007 | Nakatsu et al. | 361/703 |
| 7,324,342 | B2 * | 1/2008 | Taylor et al. | 361/704 |
| 2004/0042179 | A1 * | 3/2004 | Murphy | 361/719 |
| 2008/0158824 | A1 * | 7/2008 | Aoki et al. | 361/711 |

FOREIGN PATENT DOCUMENTS

JP 03114288 A * 5/1991

(Continued)

OTHER PUBLICATIONS

Chinese Office Action dated Jul. 25, 2008.

*Primary Examiner*—Jayprakash N Gandhi
*Assistant Examiner*—Robert J Hoffberg
(74) *Attorney, Agent, or Firm*—Sughrue Mion, PLLC

(57) ABSTRACT

There is provided a motor control apparatus in which a size of the apparatus can easily be reduced, a work for aligning a power semiconductor module with a substrate can be eliminated and an assembling property can be enhanced.

In a motor control apparatus in which a power semiconductor module adhering to a heat sink is mounted on a first substrate, a spacer is provided between the heat sink and the substrate and the power semiconductor module is disposed in the spacer. Moreover, an edge part of a hole has such a structure as to block a space between a terminal protruded from a side portion of the power semiconductor module and the heat sink.

13 Claims, 6 Drawing Sheets

FOREIGN PATENT DOCUMENTS

| | | |
|---|---|---|
| JP | 04-44190 A | 4/1992 |
| JP | 07-003674 Y * | 1/1995 |
| JP | 7-3674 Y2 | 1/1995 |
| JP | 09-283886 A | 10/1997 |
| JP | 10-225138 A | 8/1998 |
| JP | 2002-325467 A | 11/2002 |
| JP | 2002-353385 A | 12/2002 |
| JP | 2004-151009 A | 5/2004 |
| JP | 2008135422 A * | 6/2008 |

* cited by examiner

MOTOR CONTROL APPARATUS AND METHOD OF ASSEMBLING MOTOR CONTROL APPARATUS

TECHNICAL FIELD

The present invention relates to a motor control apparatus such as an inverter apparatus or a servo pump and a method of assembling the same, and more particularly to a structure for positioning and attaching a power semiconductor module to a substrate.

BACKGROUND ART

A motor control apparatus, for example, an inverter apparatus uses a power semiconductor module for generating high heat. For this reason, the power semiconductor module is caused to adhere to a heat sink, thereby producing a cooling effect (for example, see Patent Document 1).

A conventional motor control apparatus, for example, a conventional inverter apparatus is constituted as shown in FIGS. 5 and 6.

In FIGS. 5 and 6, 11 denotes a heat sink which has a stud 12 on four corners, for example, and a substrate 15 is mounted on the stud 12 and is fixed thereto with a screw 16. A power semiconductor module 13 such as an IGBT (Insulated Gate Bipolar Transistor) and a temperature sensor 14 are mounted on a lower surface of the substrate 15. The power semiconductor module 13 is attached in close contact with an upper surface of the heat sink 11 with a screw 17. The temperature sensor 14 is a detecting device for detecting a temperature of the power semiconductor module 13 and protecting the motor control apparatus when an abnormal heat generation is caused, and is caused to adhere to the heat sink 11 with a screw 18 and is attached to the vicinity of the power semiconductor module 13, and is connected to the substrate 15 through an electrical wire 14a.

The positioning and attachment of the power semiconductor module 13 to the substrate 15 in the structure is carried out in the following manner.

First of all, the power semiconductor module 13 is temporarily fixed to the upper surface of the heat sink 11 with the screw 17.

Next, a terminal of the power semiconductor module 13 is aligned with a through hole (not shown) of the substrate 15, and at the same time, it is ascertained whether a screw inserting hole 15a of the substrate 15 is coincident with a position of the stud 12 or not. If they are not coincident with each other, a position of the power semiconductor module 13 is shifted to correct the position. If they are coincident with each other or the position of the power semiconductor module 13 is corrected so that the attachment hole of the substrate 15 is coincident with the position of the stud 12, the substrate 15 is fastened and fixed to the stud 12 with the screw 16. Then, a driver is inserted through a screw fastening hole 15b provided on the substrate 15 to really fasten the screw 17. Thus, the power semiconductor module 13 is reliably fixed to the upper surface of the heat sink 11.

After the substrate 15 is fastened and fixed to the stud 12, the terminal of the power semiconductor module 13 is soldered to the substrate 15.

Patent Document 1: JP-A-10-225138 Publication (FIG. 2)

DISCLOSURE OF THE INVENTION

Problems to be Solved

However, the conventional art having the structure has the following problems.

(1) The motor control apparatus is operated through a high voltage AC power supply such as AC200V or AC400V. Therefore, it is necessary to sufficiently maintain an insulation distance between the heat sink and the substrate and that between the heat sink and the power semiconductor module. There is a limit in an implementation of a decrease in these insulation distances in order to obtain a reduction in a size of the motor control apparatus.

(2) The power semiconductor module is temporarily fixed to the heat sink and the terminal of the power semiconductor module is aligned with the through hole of the substrate, and then, the substrate is fastened and fixed with the screw. For this reason, a long time is taken for aligning the terminal of the power semiconductor module with the through hole of the substrate.

The invention has been made to solve the problems and has an object to provide a motor control apparatus in which a size of the apparatus can easily be reduced, and furthermore, can eliminate a work for aligning the power semiconductor module with the substrate and can enhance an assembling property.

Means for Solving the Problems

In order to solve the problems, the present invention has the following structure.

A first aspect of the invention is directed to a motor control apparatus which comprises a substrate, a heat sink, a power semiconductor module which adheres to the heat sink and is mounted on the substrate, and a spacer which is provided between the heat sink and the substrate, wherein the power semiconductor module is disposed in the spacer, an engaging portion for attaching the spacer is provided on a side surface of the heat sink and an engaging portion corresponding to the engaging portion on the side surface of the heat sink is provided on a side surface of the spacer, and the engaging portion on the side surface of the spacer and the engaging portion on the side surface of the heat sink are engaged with each other in order to attach the spacer to the heat sink.

A second aspect of the invention is directed to the motor control apparatus, wherein an engaging concave portion for attaching the spacer is provided on the side surface of the heat sink and an engaging convex portion corresponding to the engaging concave portion on the side surface of the heat sink is provided on the side surface of the spacer.

A third aspect of the invention is directed to the motor control apparatus, wherein the spacer is fabricated by an adiabatic resin and covers a surface of the heat sink, and an air layer forming concave portion is provided in at least a part of a contact surface with the surface of the heat sink.

A fourth aspect of the invention is directed to the motor control apparatus, wherein an engaging portion for disposing the power semiconductor module is formed in the spacer.

A fifth aspect of the invention is directed to the motor control apparatus, wherein the power semiconductor module includes a terminal protruded from a side surface.

A sixth aspect of the invention is directed to the motor control apparatus, wherein an edge part of the engaging portion of the spacer is disposed in a lower part of the terminal of the power semiconductor module.

A seventh aspect of the invention is directed to the motor control apparatus, wherein the heat sink is formed in an insulating concave portion in a surface portion positioned under the terminal of the power semiconductor module. An eighth aspect of the invention is directed to the motor control apparatus, wherein the heat sink has a thickness of a back side portion of the insulating concave portion increased.

A ninth aspect of the invention is directed to the motor control apparatus, wherein an edge part of the engaging portion of the spacer is extended downward and is inserted into the insulating concave portion.

A tenth aspect of the invention is directed to the motor control apparatus, wherein the insulating concave portion is expanded to a lower part of the power semiconductor module and the edge part of the engaging portion of the spacer is extended to the lower part of the power semiconductor module in order to block a space between the heat sink and the terminal of the power semiconductor module.

An eleventh aspect of the invention is directed to the motor control apparatus, wherein the substrate is provided with a temperature sensor.

A twelfth aspect of the invention is directed to the motor control apparatus, wherein the temperature sensor is provided on a surface of the substrate, which is located on the side opposite to the power semiconductor module, and an air hole is provided in a position in the vicinity of the temperature sensor of the substrate.

A thirteenth aspect of the invention is directed to the motor control apparatus, wherein the substrate for connecting a power semiconductor module terminal by a solder is obtained by eliminating component mounting having a predetermined height in a peripheral part of a connecting position on a solder surface side of the power semiconductor module terminal.

A fourteenth aspect of the invention is directed to the motor control apparatus, wherein the substrate for connecting a power semiconductor module terminal by a solder has a connecting position of the power semiconductor module terminal which is disposed in a peripheral part of the substrate.

A fifteenth aspect of the invention is directed to the motor control apparatus, wherein the substrate is vertically divided into a plurality of sheets and is mounted on bosses having different heights which are provided on the spacer.

A sixteenth aspect of the invention is directed to a method of assembling a motor control apparatus in which a power semiconductor module adhering to a heat sink is mounted on a substrate and a spacer is provided between the heat sink and the substrate, the method includes putting the power semiconductor module on the substrate temporarily, and attaching the power semiconductor module and the substrate to the spacer and the heat sink collectively.

ADVANTAGE OF THE INVENTION

The invention has the following advantages.

(1) According to the first and second aspects of the invention, the number of the substrate attaching screws can be reduced, and the number of the components and an assembly man-hour, can be decreased.

(2) According to the third aspect of the invention, it is possible to reduce a heat radiation from the heat sink by covering the surface of the heat sink with the spacer formed by the adiabatic resin. By creating the air layer having an intentionally high heat resistance on a radiating surface from the heat sink into the inner part of the apparatus, furthermore, it is possible to decrease an internal volume of the apparatus and to reduce a size of the apparatus.

(3) According to the fourth aspect of the invention, it is possible to easily position the power semiconductor module with respect to the substrate and to eliminate a work for aligning the terminal of the power semiconductor module with the hole of the substrate. Moreover, the components for the positioning can be implemented by only the spacer. Therefore, it is possible to decrease the number of the components.

(4) According to the fifth to ninth aspects of the invention, it is possible to maintain the insulation distance between the heat sink and the substrate and that between the heat sink and the power semiconductor module. Thus, it is possible to reduce the size of the apparatus.

(5) According to the tenth aspect of the invention, it is possible to reliably block a space between the heat sink and the terminal of the power semiconductor module. Therefore, it is possible to reliably maintain the insulation distance between the heat sink and the substrate and that between the heat sink and the power semiconductor module. Thus, a reliability of the insulation can be enhanced more greatly.

(6) According to the eleventh aspect of the invention, it is possible to omit the attachment screw of the temperature sensor. Thus, it is possible to reduce the number of the components and an assembly man-hour.

(7) According to the twelfth aspect of the invention, it is possible to effectively utilize a space in the attachment of the temperature sensor to the substrate.

(8) According to the thirteenth to fifteenth aspects of the invention, it is possible to carry out a soldering work by using an automatic soldering apparatus, which is usually referred to as a spot solder or a multipoint solder. Consequently, it is possible to decrease the number of the manual soldering works, thereby reducing an assembly man-hour.

(9) According to the sixteenth aspect of the invention, it is possible to easily position the power semiconductor module with respect to the substrate and to eliminate the work for aligning the terminal of the device with the hole of the substrate. Consequently, it is possible to reduce the assembly man-hour.

Figure 1:
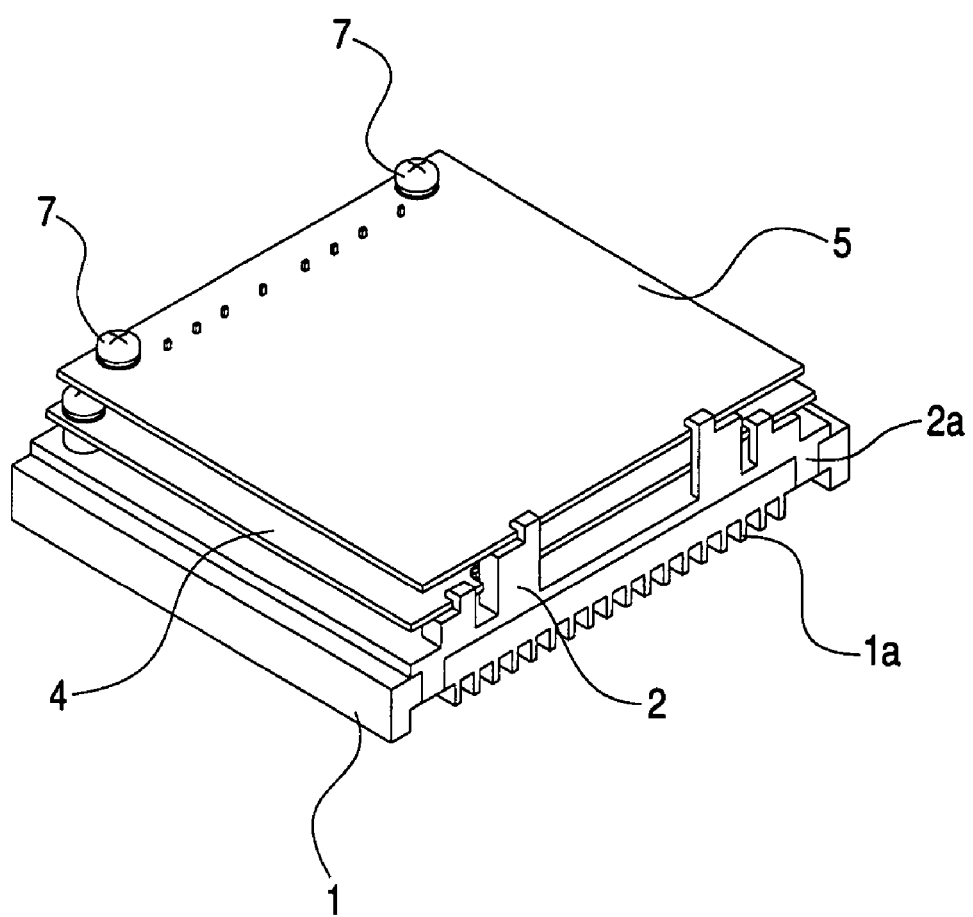
FIG. 1 is a perspective view showing a motor control apparatus according to the invention.

EXPLANATION OF THE DESIGNATIONS 1 heat sink
1a fin
1b insulating concave portion
1c screw hole
1d engaging concave portion
2 spacer
2a engaging convex portion
2b first boss
2c second boss
2d first support portion
2e second support portion
2f first engaging portion
2g second engaging portion
2h engaging portion
2j lower surface convex portion
2k lower surface concave portion
2m air layer
3 power semiconductor module
4 first substrate
4a screw inserting hole
4b notch
4c temperature sensor
4d air hole 4e terminal inserting hole
4f screw fastening hole
5 second substrate
5a screw inserting hole
6 first substrate fixing screw
7 second substrate fixing screw
8 power semiconductor module fixing screw
11 heat sink
12 stud
13 power semiconductor module
14 temperature sensor
14a electrical wire
15 substrate
15a screw inserting hole
15b screw fastening hole
16 substrate fixing screw
17 power semiconductor module fixing screw
18 temperature sensor fixing screw

BEST MODE FOR CARRYING OUT THE INVENTION

An embodiment of the invention will be described below with reference to the drawings.

First Example

Figure 2:
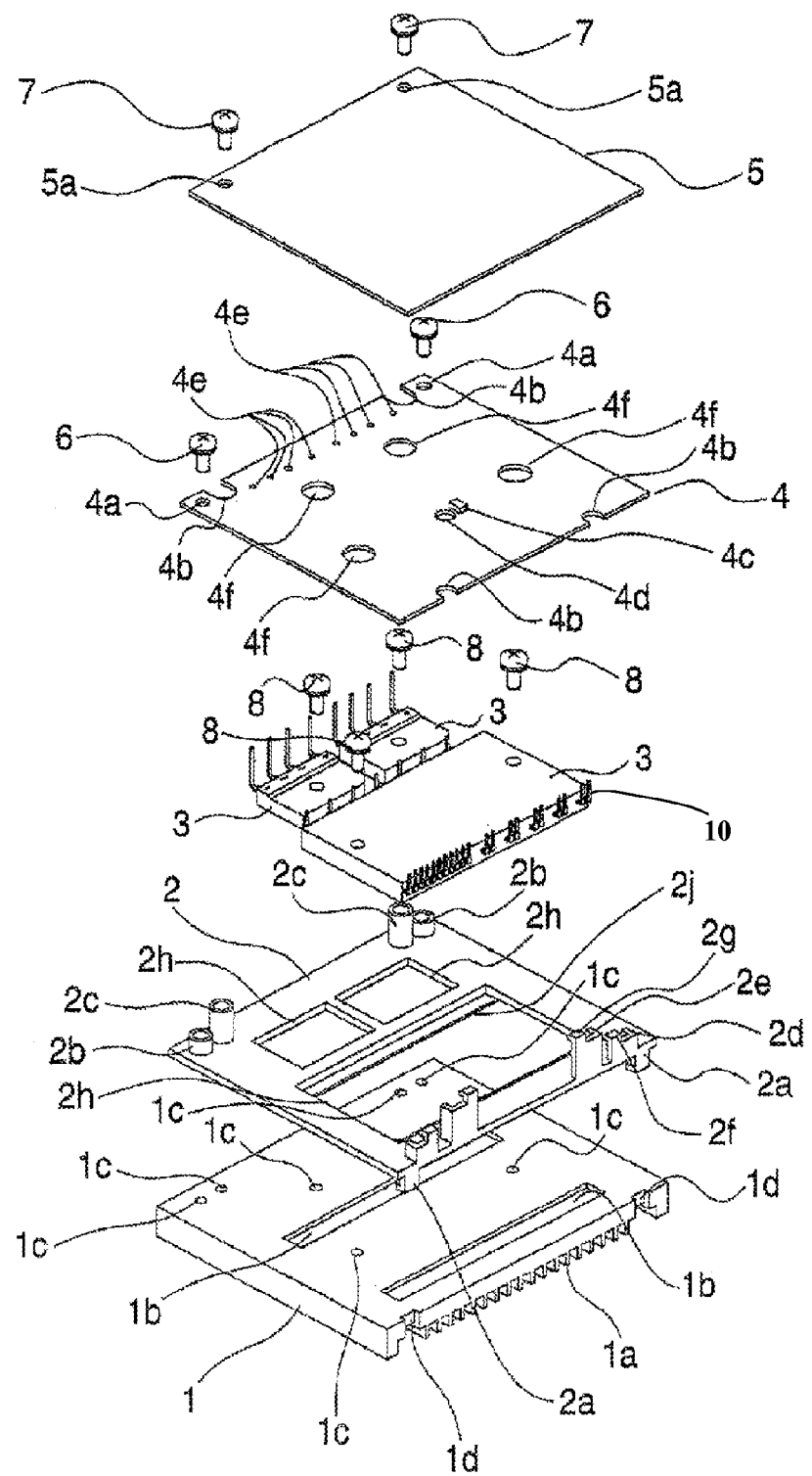
FIG. 2 is an exploded perspective view showing the motor control apparatus in FIG. 1.
Figure 3A:
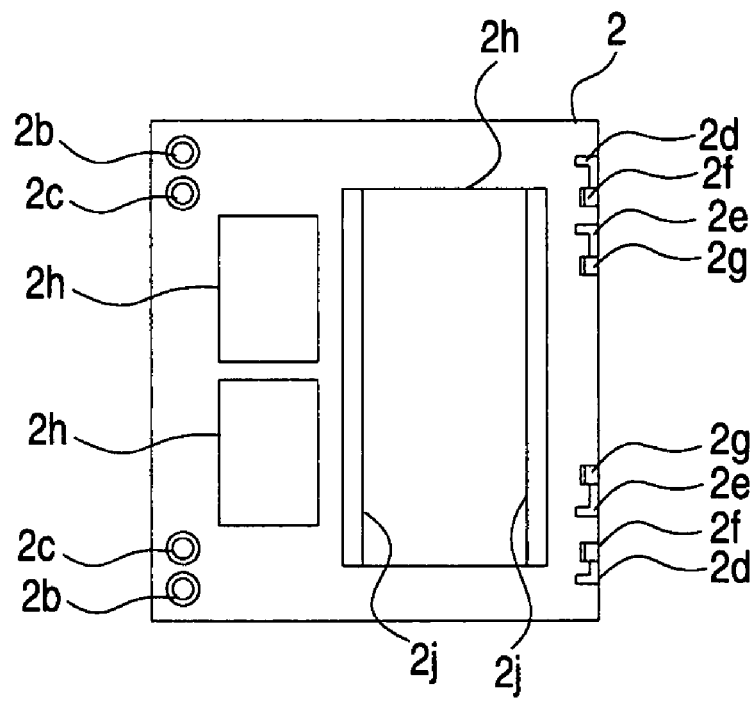
FIG. 3A is a plan view showing a spacer in FIG. 1.
Figure 3B:
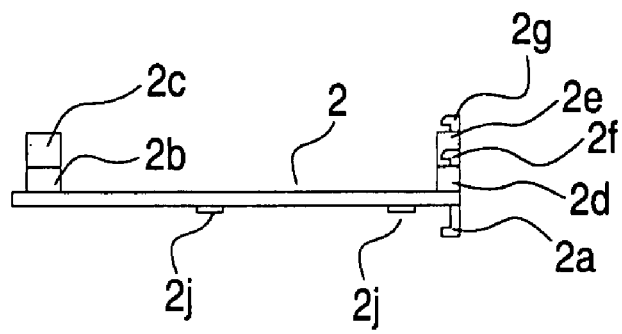
FIG. 3B is a front view showing a spacer in FIG. 1.
Figure 4:
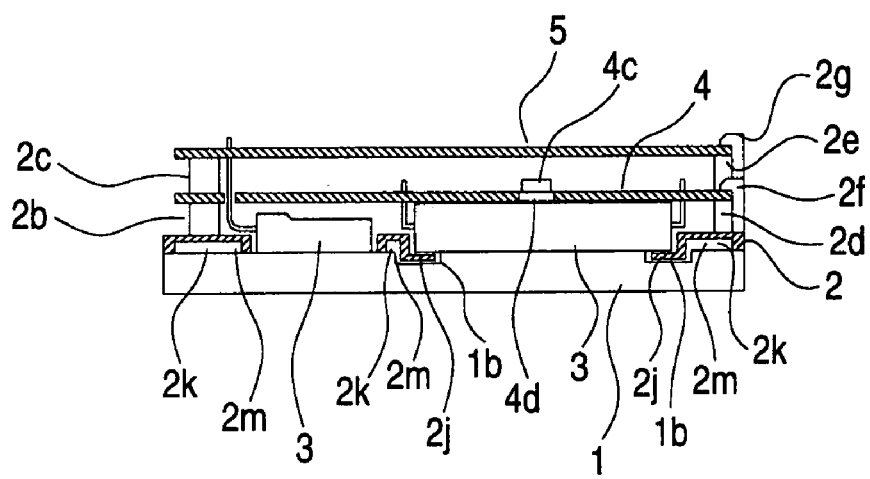
FIG. 4 is a schematic sectional view showing the motor control apparatus in FIG. 1.
Figure 5:
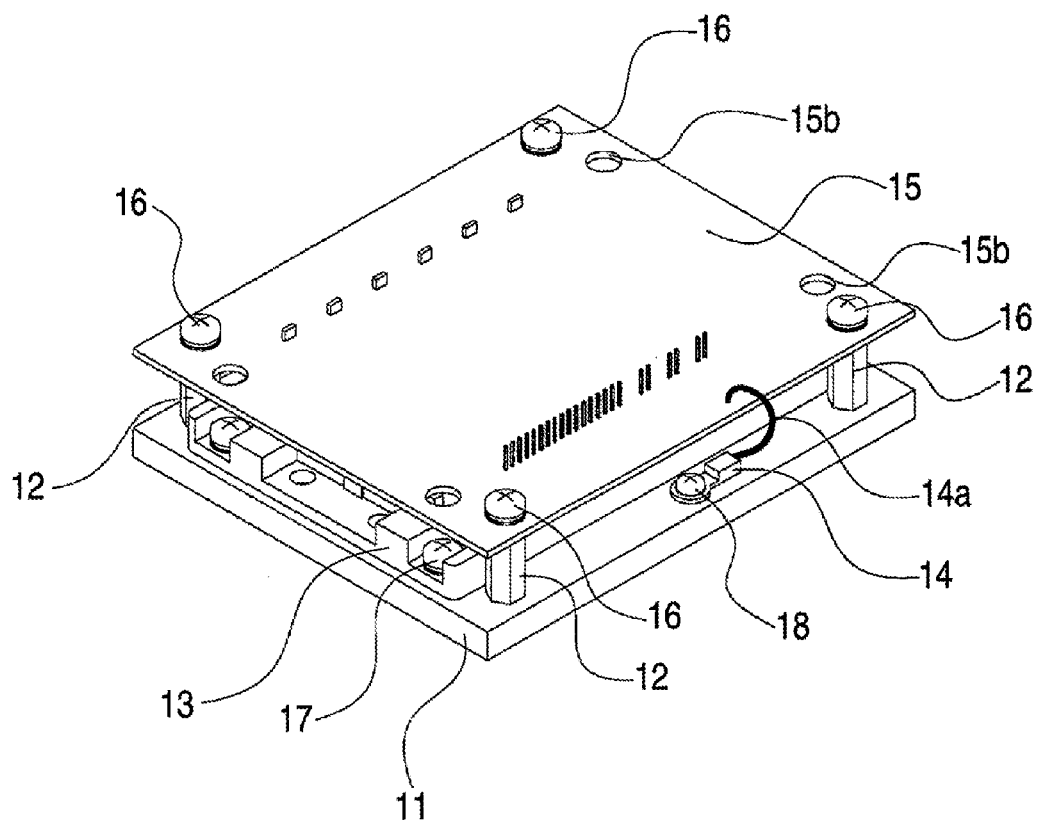
FIG. 5 is a perspective view showing a motor control apparatus according to the conventional art.
Figure 6:
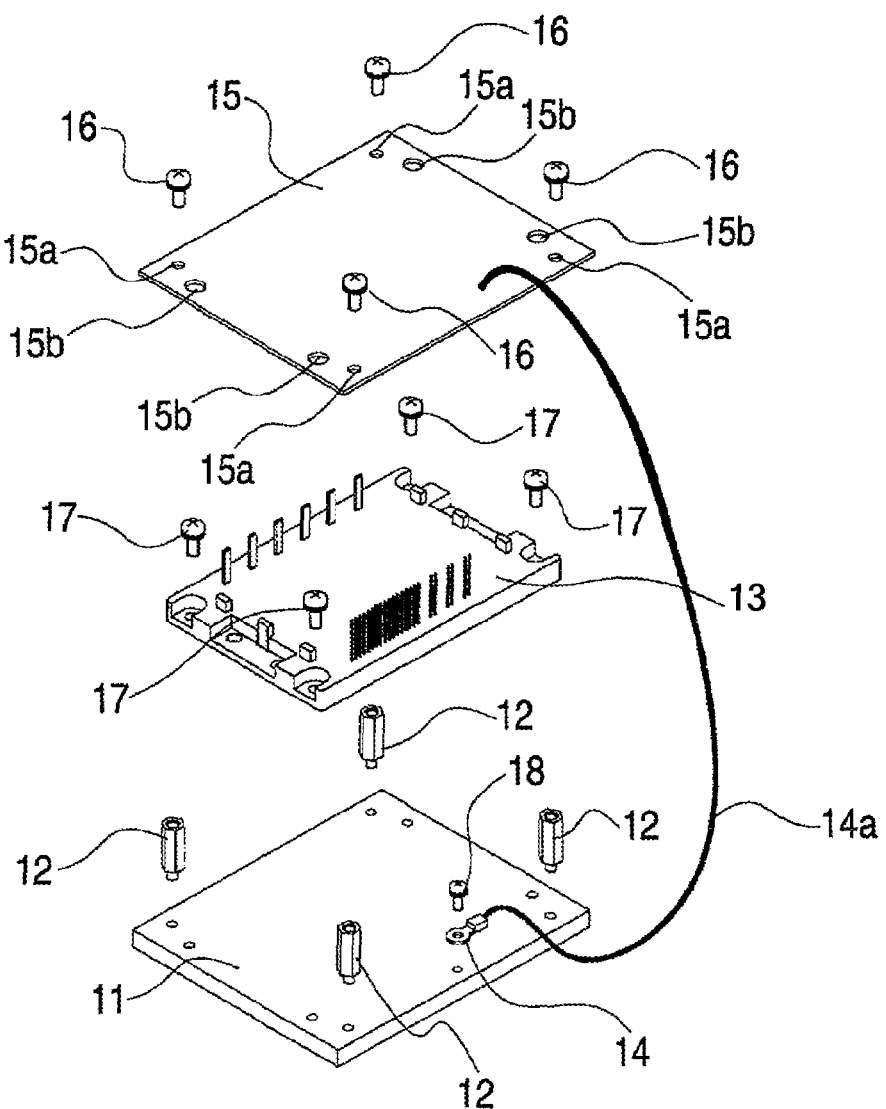
FIG. 6 is an exploded perspective view showing the motor control apparatus in FIG. 5.

FIG. 1 is a perspective view showing a motor control apparatus according to the invention. FIG. 2 is an exploded perspective view showing the motor control apparatus in FIG. 1. FIG. 3A is a plan view showing a spacer in FIG. 1. FIG. 3B is a front view showing a spacer in FIG. 1. FIG. 4 is a schematic sectional view showing the motor control apparatus in FIG. 1.

In FIGS. 1 to 4, 1 denotes a heat sink, 2 denotes a spacer integrated and constituted by an adiabatic resin having a low thermal conductivity, for example, and 3 denotes a power semiconductor module such as an IGBT or a diode, which has such a structure that a plurality of terminals is protruded exactly transversely from a side surface and is extended upward in a middle, for example. 4 denotes a first substrate and 5 denotes a second substrate.

The heat sink 1 takes a shape of a rectangular parallelepiped, for example, and an upper surface is formed like a plane and a lower surface has a fin 1a formed thereon. The upper surface is provided with a plurality of insulating concave portions 1b for causing the spacer 2 to get into the power semiconductor module 3 and a plurality of screw holes 1c for attaching the spacer 2 and the power semiconductor module 3 to the heat sink 1. A side surface is provided with an engaging concave portion 1d for attaching the spacer 2.

The spacer 2 is mounted on the upper surface of the heat sink 1 and is constituted by a rectangular parallelepiped which is equivalent to or smaller than the heat sink 1, for example (which is constituted to be smaller than the heat sink 1 in the example). The spacer 2 has an engaging convex portion 2a provided in a position corresponding to the engaging concave portion 1d of the heat sink 1. Moreover, the upper surface is provided with a first boss 2b having a plane on the same level in two places on an opposite side of the engaging convex portion 2a and a second boss 2c having a plane which is higher than an upper surface of the first boss 2b in two places in the vicinity of or on an opposite side of the first boss 2b (in the vicinity in the example). The first boss 2b serves to fasten and fix the first substrate 4 with a screw 6, and the second boss 2c serves to fasten and fix the second substrate 5 with a screw 7. Furthermore, a first support portion 2d having a plane on the same level with the first boss 2b is formed on an opposite side of the first boss 2b, a second support portion 2e having a plane on the same level with the second boss 2c is formed on an opposite side of the second boss 2c, a first engaging portion 2f is formed in the vicinity of the first support portion 2d, and a second engaging portion 2g is formed in the vicinity of the second support portion 2e. The first support portion 2d and the first engaging portion 2f serve to engage the first substrate 4, and the second support portion 2e and the second engaging portion 2g serve to engage the second substrate 5.

Moreover, the spacer 2 is provided with an engaging portion 2h for positioning and disposing each power semiconductor module 3 in an inner part. The engaging portion 2h is constituted by a hole formed on the spacer 2 or a notch, for example (the hole in the example).

Furthermore, a lower surface is provided with a convex portion 2j in a position corresponding to the insulating concave portion 1b of the heat sink 1, and a surface of the heat sink 1 is covered with the spacer 2 formed by an adiabatic resin in order to reduce a heat radiation from the heat sink 1. Furthermore, an air layer forming concave portion 2k is formed on a whole surface (at least a part), and an air layer 2m having a high heat resistance is intentionally formed between the heat sink 1 and the spacer 2 in order to make it harder to transmit heat from the heat sink 1 to the inner part of the apparatus Consequently, an internal volume of the apparatus is decreased so that a size of the apparatus is reduced.

While the power semiconductor module 3 is inserted into the engaging portion 2h of the spacer 2 which is constituted by the hole and is thus disposed, an edge part of the engaging portion 2h enters a lower part of the terminal 10 protruded from a side portion of the power semiconductor module 3. Consequently, the edge part of the engaging portion 2h blocks most of a space between the terminal of the power semiconductor module 3 and the heat sink 1 so that the insulating property between the terminal of the power semiconductor module 3 and the heat sink 1 can be enhanced.

As shown in FIG. 4, moreover, the insulating concave portion 1b is formed in a surface part positioned under the terminal of the power semiconductor module 3 in the heat sink 1 so that an insulation distance between the terminal of the power semiconductor module 3 and the heat sink 1 is increased and the insulating property can be improved. In this case, if the edge part of the engaging portion 2h of the spacer 2 is extended downward and is inserted in the insulating concave portion 1b, a space between the terminal of the power semiconductor module 3 and the heat sink 1 can be blocked more greatly.

In addition, if the insulating concave portion 1b is expanded to the lower part of the power semiconductor module 3, and furthermore, the edge part of the engaging portion 2h of the spacer 2 is extended to the lower part of the power semiconductor module 3, the space between the heat sink 1 and the terminal of the power semiconductor module 3 is perfectly blocked so that the insulating property can be greatly improved.

The first substrate 4 has a screw inserting hole 4a formed in a position corresponding to the first boss 2b, and is mounted on the first support portion 2d and the first boss 2b, and is engaged through the first engaging portion 2f and is fastened and fixed to the first boss 2b with the screw 6. The first substrate 4 is positioned in a vertical direction by means of the first boss 2b.

The second substrate 5 is disposed at an interval above the first substrate 4. However, the second boss 2c and the second support portion 2e, which serve to mount the second substrate 5 thereon, are formed on the spacer 2. Therefore, the first substrate 4 is provided with a notch 4b in order to avoid an interference between the second boss 2c and the second support portion 2e.

Moreover, a temperature sensor 4c is attached to the upper or lower surface of the first substrate 4 (the upper surface in the example). The temperature sensor 4c serves to monitor a temperature of the power semiconductor module 3 and is desirably as close to the power semiconductor module 3 as possible. However, by providing the spacer 2 between the heat sink 1 and the first substrate 4, it is possible to maintain the insulating property between the heat sink 1 and the first substrate 4 and to decrease the distance between the heat sink 1 and the first substrate 4. Consequently, it is possible to put the temperature sensor 4c close to the power semiconductor module 3. In the case in which the temperature sensor 4c is attached to an upper surface of the first substrate 4, which is located on the side opposite to the power semiconductor module 3 with the aim of the effective utilization of an empty space (in case of the example), an air hole 4d is provided on the first substrate 4 in the vicinity of the temperature sensor 4c so that the heat generation of the power semiconductor module 3 can be efficiently transmitted to the temperature sensor 4c.

In the case in which the terminal of the power semiconductor module 3 is not attached to the first substrate 4 but is soldered to the second substrate 5, a terminal inserting hole 4e is provided on the first substrate 4 in a position corresponding to the terminal of the power semiconductor module 3. The terminal inserting hole 4e serves to position and dispose the power semiconductor module 3. Moreover, there is provided a screw fastening hole 4f of a screw 8 for fixing the power semiconductor module 3 to the heat sink 1.

The second substrate 5 is provided with a screw inserting hole 5a formed in a position corresponding to the second boss 2c, and furthermore, is mounted on the second support portion 2e and the second boss 2c and is engaged through the second engaging portion 2g, and is thus fastened and fixed to the second boss 2c with the screw 7. The second substrate 5 is positioned in a vertical direction through the second boss 2c.

The positioning and attachment of the power semiconductor module 3 to the first substrate 4 and the second substrate 5 in the structure can also be carried out in the following manner.

First of all, the first substrate 4 is inverted and is fixed by means of a proper jig.

Next, the power semiconductor module 3 is inverted and the terminal of the power semiconductor module 3 is inserted into the through hole or the terminal inserting hole 4e of the first substrate 4 which is inverted, and the power semiconductor module 3 is temporarily put and mounted on the upper surface of the first substrate 4 which is inverted. Subsequently, the spacer 2 is inverted and the first boss 2b is engaged with the screw inserting hole 4a of the first substrate 4 which is inverted and is engaged through the first engaging portion 2f, and the spacer 2 is mounted on the upper surface of the first substrate 4 which is inverted.

Then, the heat sink 1 is inverted and the screw hole 1c is engaged with the first boss 2b of the spacer 2 which is inverted, and furthermore, the engaging concave portion 1d is engaged with the engaging convex portion 2a of the spacer 2 which is inverted and the heat sink 1 is mounted on the upper surface of the spacer 2 which is inverted. The first substrate 4, the power semiconductor module 3, the spacer 2 and the heat sink 1 are inverted and returned to an original condition with the state maintained. Thereafter, the screw 6 is inserted through the screw inserting hole 4a of the first substrate 4 and the screw inserting hole of the first boss 2b of the spacer 2, and furthermore, is fixed into the screw hole 1c of the heat sink 1 so that the first substrate 4 is fastened and fixed to the heat sink 1 through the spacer 2.

Thereafter, the screw 8 is inserted through the screw inserting hole of the power semiconductor module 3, and furthermore, is fixed to the screw hole 1c of the heat sink 1 so that the power semiconductor module 3 is fastened and fixed to the heat sink 1 by using a driver through the screw fastening hole 4f provided on the first substrate 4. In this state, the terminal of the power semiconductor module 3 (the power semiconductor module 3 on a right side shown in FIG. 4) soldered to the first substrate 4 is soldered to the first substrate 4.

The power semiconductor module 3 is fastened and fixed to the heat sink 1 and the screw inserting hole 5a is then engaged with the second boss 2c of the spacer 2, and the second substrate 5 is thus engaged through the second engaging portion 2g of the spacer 2 and is mounted on the upper surface of the second boss 2c of the spacer 2. Thereafter, the screw 7 is inserted through the screw inserting hole 5a of the second substrate 5 and the screw inserting hole of the second boss 2c, and furthermore, is fixed into the screw hole 1c of the heat sink 1 so that the second substrate 5 is fastened and fixed to the heat sink 1 through the spacer 2. At this time, the screw 7 is covered with the second boss 2c of the spacer 2 formed by a resin. Therefore, an insulation distance from the first substrate 4 can be maintained. In this state, the terminal of the power semiconductor module 3 to be soldered to the second substrate 5 is soldered to the second substrate 5. The power semiconductor module 3 to be soldered to the second substrate 5 has already been positioned by inserting the terminal of the power semiconductor module 3 through the terminal inserting hole 4e of the first substrate 4. Therefore, a work for aligning the power semiconductor module 3 is not required. The positioning and attachment of the power semiconductor module 3 to the first substrate 4 and the second substrate 5 is carried out by holding and inverting the heat sink 1. Even if the heat sink 1 is neither held nor inverted, however, the power semiconductor module 3 may be interposed between the first substrate 4 and the spacer 2, and then they may be turned over into the original condition so as to be exactly mounted on the heat sink 1. In case of a machine model having a large heat sink 1 or a woman operator, this working method is preferable.

While the terminal of the power semiconductor module 3 is soldered to the first substrate 4, the soldering work is very complicated because a large number of terminals are provided. For this reason, the soldering work carried out by the operator himself (herself) has a very poor efficiency. Consequently, the soldering work is carried out by using an automatic soldering apparatus to reduce an assembly man-hour.

The automatic soldering apparatus will be briefly described.

The automatic soldering apparatus is usually referred to as a spot solder or a multipoint solder, and has the following structure.

A plurality of solder nozzles is extended from a bottom portion of the apparatus and a unit having a substrate attached thereto is inverted and fixed in such a manner that a position of a device pin is engaged with that of the solder nozzle.

When the automatic soldering apparatus is operated in this state, the solder nozzle is filled with a solder for a certain time at a certain temperature and then the solder is supplied to the device pin. Although a manual solder can be carried out every point, consequently, the automatic soldering apparatus can collectively carry out the soldering operation for a plurality of points. Accordingly, it is possible to shorten a time (to reduce a man-hour), and furthermore, to reduce the man-hour and to stabilize quality by abolishing a manual work.

However, the automatic soldering apparatus has the following drawbacks.

(1) A component cannot be mounted on the substrate in an engaging portion of the solder nozzle and the substrate.

Since the solder nozzle is heated up, a component (a covering of a capacitor) is molten when it comes in contact with the solder nozzle. For this reason, the component is to be prevented from coming in contact with the solder nozzle. Therefore, the component cannot be mounted around the engaging portion to some degree.

(2) If a substrate mounting component includes a component having a great height (particularly, an electrolytic capacitor is an obstacle in many cases), a height of the solder nozzle is increased so that a temperature is controlled with difficulty and a yield is deteriorated.

In order to eliminate the drawbacks, the invention employs the following structure.

For the drawback in (1), a plurality of substrates (two substrates in the example) is used to maintain a sufficient substrate mounting area. In addition, in the substrate for connecting a power semiconductor module terminal by a solder, a connecting position of the power semiconductor module terminal is disposed in a peripheral part of the substrate having a small number of components provided therearound.

For the drawback in (2), moreover, the mounting of a component having a predetermined height is eliminated in the peripheral portion of the connecting position on a solder surface side of the substrate for connecting the power semiconductor module terminal by a solder, for example, the component having a great height is replaced with components having small heights.

Since the spacer is provided between the heat sink and the substrate in the motor control apparatus according to the invention, the following functions and advantages can be obtained.

(1) The power semiconductor module can easily be positioned with respect to the substrate, and the work for aligning the terminal of the power semiconductor module with the substrate can be eliminated. Moreover, only the spacer can serve as the component for positioning. Therefore, it is possible to reduce the number of the components.

(2) The spacer is constituted by the insulating member. Even if the interval between the first substrate and the power semiconductor module is not great, therefore, it is possible to reliably maintain the insulation distance by means of the spacer. Consequently, it is possible to reduce the size of the apparatus. Moreover, only the spacer can serve as the component for attaching the first substrate and the second substrate. Therefore, it is possible to reduce the number of the components.

(3) The spacer is fabricated by a resin having a low thermal conductivity. By providing the spacer between the heat sink and the substrate, therefore, it is possible to prevent a heat radiation from the heat sink. Consequently, a distance between the substrate and the heat sink can be shortened and the size of the apparatus can be reduced, and furthermore, a plurality of substrates can be mounted on the heat sink with a simple structure.

Moreover, the power semiconductor module is first put temporarily on the substrate and is thus assembled. Consequently, it is possible to eliminate a work for aligning the terminal of the power semiconductor module with the substrate which is very complicated in the conventional art. Therefore, it is possible to reduce an assembly man-hour.

INDUSTRIAL APPLICABILITY

The invention relates to a motor control apparatus such as an inverter apparatus or a servo amplifier and a method of assembling the same, and more particularly, can be utilized in a field for manufacturing and providing a motor control apparatus in which a size of the apparatus can easily be reduced, a work for aligning a power semiconductor module with a substrate can be eliminated and an assembling property can be improved by an application to a positioning and attaching structure of the power semiconductor module with respect to the substrate.

The invention claimed is:

1. A motor control apparatus comprising:
   a substrate;
   a heat sink;
   a power semiconductor module which adheres to the heat sink and is mounted on the substrate; and
   a spacer which is provided between the heat sink and the substrate, wherein the power semiconductor module is disposed in the spacer,
   a first engaging portion for attaching the spacer is provided on a side surface of the heat sink and a second engaging portion corresponding to the first engaging portion is provided on a side surface of the spacer, and
   the first and second engaging portions are engaged with each other in order to attach the spacer to the heat sink, and
   wherein the spacer is fabricated by an adiabatic resin and covers a surface of the heat sink, and an air layer forming concave portion is provided in at least a part of a contact surface with the surface of the heat sink.

2. The motor control apparatus according to claim 1, wherein the first engaging portion is an engaging concave portion, and
   the second engaging portion is an engaging convex portion.

3. The motor control apparatus according to claim 1, wherein
   a convex portion for disposing the power semiconductor module is formed in the spacer.

4. The motor control apparatus according to claim 1, wherein
   the power semiconductor module includes a terminal protruded from a side surface thereof.

5. The motor control apparatus according to claim 4, wherein
   the heat sink has an insulating concave portion formed in a surface portion positioned under the terminal of the power semiconductor module.

6. The motor control apparatus according to claim 5, wherein
   convex portion of the spacer is extended downward and is inserted into the insulating concave portion.

7. The motor control apparatus according to claim 6, wherein
   the insulating concave portion is expanded to a lower part of the power semiconductor module and the convex portion of the spacer is extended to the lower part of the power semiconductor module in order to block a space between the heat sink and the terminal of the power semiconductor module.

8. The motor control apparatus according to claim 1, wherein
   the substrate is provided with a temperature sensor.

9. The motor control apparatus according to claim 8, wherein
   the temperature sensor is provided on a surface of the substrate, which is located on the side opposite to the power semiconductor module, and an air hole is provided in the vicinity of the temperature sensor of the substrate.

10. The motor control apparatus according to claim 1, wherein
    the substrate for connecting a power semiconductor module terminal is obtained by eliminating component mounting having a predetermined height in a peripheral part of a connecting position of the power semiconductor module terminal.

11. The motor control apparatus according to claim 1, wherein
    the substrate for connecting a power semiconductor module terminal has a connecting position of the power semiconductor module terminal which is disposed in a peripheral part of the substrate.

12. The motor control apparatus according to claim 1, wherein
the substrate is vertically divided into a plurality of sheets and is mounted on bosses, which have different heights and are provided on the spacer.

13. A motor control apparatus comprising:
a substrate;
a heat sink;
a power semiconductor module which adheres to the heat sink and is mounted on the substrate; and
a spacer which is provided between the heat sink and the substrate, wherein
the power semiconductor module is disposed in the spacer,
a first engaging portion for attaching the spacer is provided on a side surface of the heat sink and a second engaging portion corresponding to the first engaging portion is provided on a side surface of the spacer, and
the first and second engaging portions are engaged with each other in order to attach the spacer to the heat sink, wherein
the power semiconductor module includes a terminal protruded from a side surface thereof, and
wherein a convex portion of the spacer is disposed between the heat sink and the terminal of the power semiconductor module.

* * * * *